(12) United States Patent
Zhang et al.

(10) Patent No.: US 9,992,563 B2
(45) Date of Patent: Jun. 5, 2018

(54) MEMS MICROPHONE

(71) Applicants: Jinyu Zhang, Shenzhen (CN); Hu Chen, Shenzhen (CN)

(72) Inventors: Jinyu Zhang, Shenzhen (CN); Hu Chen, Shenzhen (CN)

(73) Assignee: AAC TECHNOLOGIES PTE. LTD., Singapore (SG)

( * ) Notice: Subject to any disclaimer, the term of this patent is extended or adjusted under 35 U.S.C. 154(b) by 0 days. days.

(21) Appl. No.: 15/417,207

(22) Filed: Jan. 26, 2017

(65) Prior Publication Data

US 2018/0115811 A1 Apr. 26, 2018

(30) Foreign Application Priority Data

Oct. 25, 2016 (CN) ...................... 2016 2 1165108 U

(51) Int. Cl.
| | |
|---|---|
| *H04R 19/04* | (2006.01) |
| *H04R 1/02* | (2006.01) |
| *H04R 19/00* | (2006.01) |
| *H04R 1/08* | (2006.01) |

(52) U.S. Cl.
CPC ............. *H04R 1/023* (2013.01); *H04R 1/086* (2013.01); *H04R 19/005* (2013.01); *H04R 19/04* (2013.01); *B81B 2201/0257* (2013.01); *H04R 2201/003* (2013.01); *H04R 2499/11* (2013.01)

(58) Field of Classification Search
CPC ...... H04R 1/086; H04R 19/005; H04R 19/04; H04R 23/006; H04R 2201/003; H04R 2499/11; H04R 1/023; H04M 1/03; H04M 1/035; B81B 7/0038; B81B 2201/0257
USPC ....... 381/113, 116, 355, 356, 357, 360, 369, 381/173, 174, 175, 191; 367/170, 180; 257/415, 416; 438/51; 181/149; 455/550.1, 575.1

See application file for complete search history.

(56) References Cited

U.S. PATENT DOCUMENTS

| | | | | |
|---|---|---|---|---|
| 8,494,577 | B2 * | 7/2013 | Shiogama | H04M 1/035 455/550.1 |
| 2011/0272769 | A1 * | 11/2011 | Song | H04R 19/005 257/416 |
| 2014/0294217 | A1 * | 10/2014 | Yamaguchi | H04M 1/035 381/334 |
| 2015/0273524 | A1 * | 10/2015 | Ely | G10K 9/22 310/322 |
| 2016/0277844 | A1 * | 9/2016 | Kopetz | H04R 3/00 |
| 2017/0121173 | A1 * | 5/2017 | Hoekstra | B81B 7/0077 |

* cited by examiner

*Primary Examiner* — Huyen D Le
(74) *Attorney, Agent, or Firm* — Na Xu; IPro, PLLC

(57) ABSTRACT

An MEMS microphone is provided in the present disclosure. The MEMS microphone includes a protective structure comprising a housing and a PCB substrate covering the housing to form a receiving space, the housing is provided with a sound hole, an MEMS chip with a back cavity, received in the receiving space and fixed on the PCB substrate, the back cavity is communicated with the sound hole, and the MEMS chip comprises a first surface away from the PCB substrate and a second surface opposite to the first surface; and a waterproof part, bonded to the first surface of the MEMS chip.

10 Claims, 5 Drawing Sheets

MEMS MICROPHONE

FIELD OF THE DISCLOSURE

The present disclosure generally relates to microphone, and more particularly, to an MEMS microphone.

BACKGROUND

The micro electro mechanical system (MEMS) microphone is an electrical sound transducer manufactured by using a micro mechanical machining technology, and has the characteristics of small size, good frequency response, low noise and the like. With the development of small, light and thin electronic equipment, MEMS microphones have been increasingly widely applied to the equipment.

In relevant technologies, MEMS microphones generally have a waterproof structure that a waterproof net is directly stuck to the interior at a sound hole of a metal shell, or a waterproof net is stuck to a sound hole formed in a printed circuit board (PCB) substrate, PCB substrate. The waterproof net is substantially woven by adopting an organic material, and shrinks seriously at an over-high temperature, so that the waterproof property and the acoustic performance are greatly influenced.

Therefore, it is desired to provide a microphone to overcome the aforesaid problems.

BRIEF DESCRIPTION OF THE DRAWINGS

Many aspects of the embodiments can be better understood with reference to the following drawings. The components in the drawing are not necessarily drawn to scale, the emphasis instead being placed upon clearly illustrating the principles of the present disclosure. Moreover, in the drawings, like reference numerals designate corresponding parts throughout the several views.

DETAILED DESCRIPTION

The present disclosure will be described in detail below with reference to the attached drawings and embodiments thereof.

Embodiment 1

Figure 1:
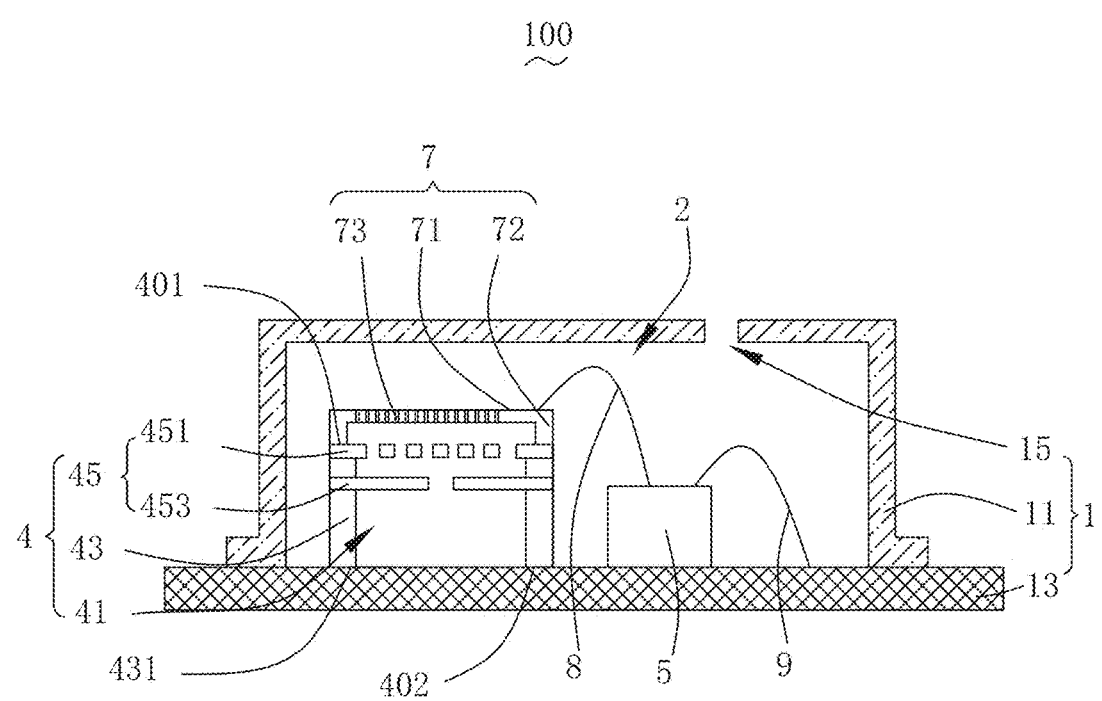
FIG. 1 is a structural schematic diagram of embodiment 1 of an MEMS microphone of the present disclosure.
Figure 2:
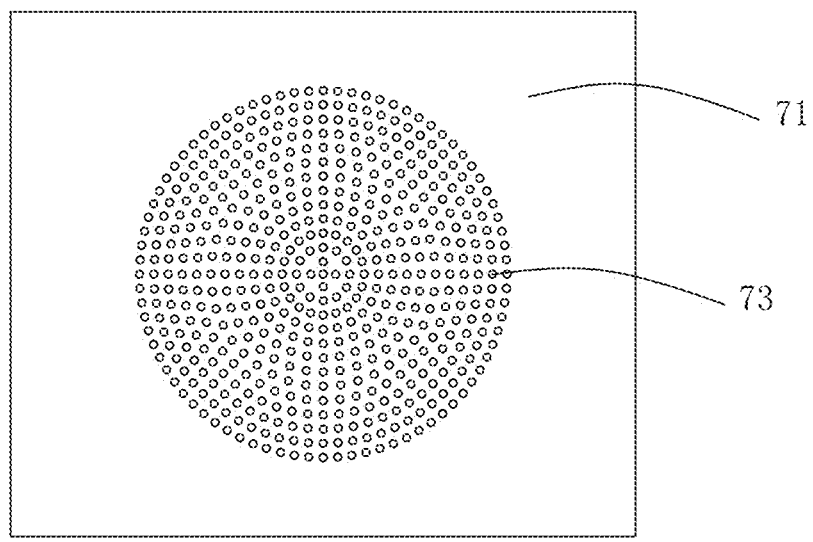
FIG. 2 is a structural schematic diagram of a waterproof part shown in FIG. 1.

Referring to FIGS. 1 and 2, an MEMS microphone 100 includes a protective structure 1 with a receiving space 2, an MEMS chip 4 and an ASIC chip 5 received in the receiving space 2, a waterproof part 7 bonded to the MEMS chip 4, a first gold thread 8 and a second gold thread 9.

The protective structure 1 includes a housing 11 and a PCB substrate 13 covering the housing 11 to form the receiving space 2, and the housing 11 is provided with a sound hole 15. The housing 11 may be a metal casing with a protective effect, and is used for shielding external interference signals.

The MEMS chip 4 and the ASIC chip 5 are fixed on the PCB substrate 13, wherein the MEMS chip 4 is electrically connected with the ASIC chip 5 via the first gold thread 8, and the ASIC chip 5 is electrically connected with the PCB substrate 13 via the second gold thread 9.

The MEMS chip 4 includes a first surface 401 away from the PCB substrate 13 and a second surface 402 opposite to the first surface 401. The MEMS chip 4 includes a base 43 with a back cavity 41 and a capacitor structure 45 disposed on the base 43. The back cavity 41 is communicated with the sound hole 15. The base 43 includes a base bottom surface 431 located at the opening of the back cavity 41 and disposed close to the PCB substrate 13. The capacitor structure 45 includes a backplate 451 and a diaphragm 453 opposite to the backplate 451, and the position and quantity of the backplate 451 and the diaphragm 453 are not limited.

The waterproof part 7 is bonded to the first surface 401 of the MEMS chip 4, and specifically, the waterproof part 7 is disposed above the backplate 451 of the MEMS chip 4. The waterproof part 7 includes a bottom plate 71, a vertical wall 72 bent and extended from the bottom plate 71 and a plurality of through holes 73 formed in the bottom plate 71 and distributed uniformly, a depression is formed between the bottom plate 71 and the vertical wall 72, the bottom plate 71 is bonded to the upper part of the backplate 451, and the vertical wall 72 is fixed on the backplate 451.

The waterproof part 7 is directly bonded onto the MEMS chip 4 by a semiconductor process, so that the bonding cost is low, and the MEMS microphone 100 has the advantage of high consistency on waterproof performance; meanwhile, when the MEMS microphone 100 is packaged, the assembly procedure is simpler.

Preferably, the aperture of the through holes 73 is 0.6-1.4 μm and is much smaller than the size of water drops (the diameter of the water drops is generally above 500 μm), of course, the aperture of the through holes 73 can be larger, as long as a good waterproof effect is achieved, and the waterproof part 7 thus has good waterproof performance without influencing acoustic transmission.

The waterproof part 7 is used for preventing water seepage of the MEMS chip and is made of a silicon nitride material, wherein silicon nitride is a structural ceramic material and a super-hard material and itself has the properties of high temperature resistance and cold and thermal shock resistance, so that the waterproof part 7 of the present disclosure can tolerate a temperature of above 350° C., which is much higher than the temperature tolerance upper limit of the waterproof net in the prior art (the temperature tolerance upper limit of the waterproof net is generally 260° C.).

Embodiment 2

Figure 3:
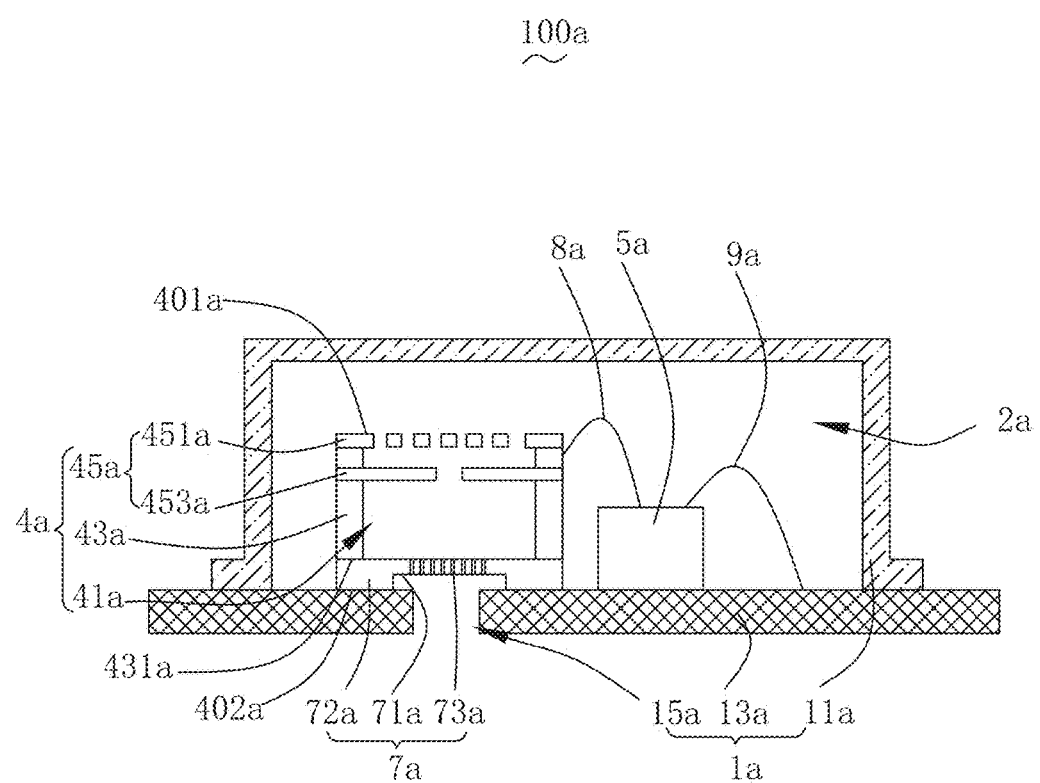
FIG. 3 is a structural schematic diagram of embodiment 2 of an MEMS microphone of the present disclosure.
Figure 4:
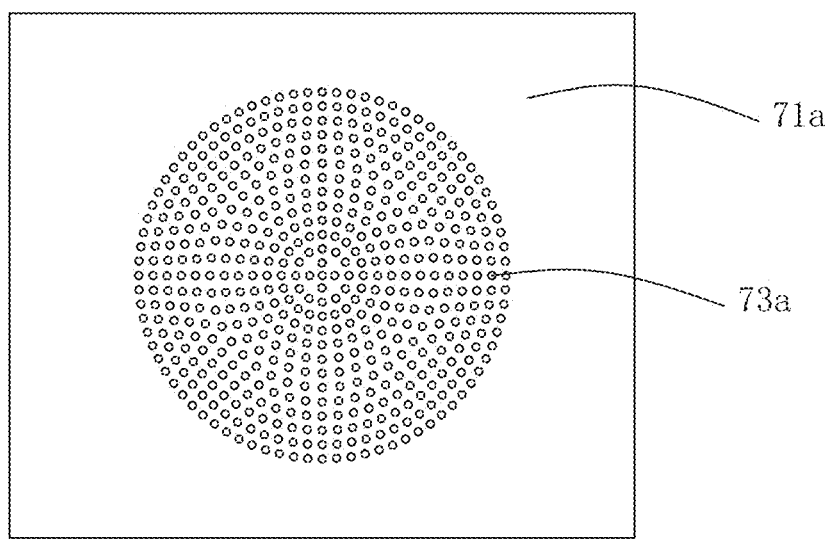
FIG. 4 is a structural schematic diagram of a waterproof part shown in FIG. 3.

Referring to FIGS. 3 and 4, an MEMS microphone 100a includes a protective structure 1a with a receiving space 2a, an MEMS chip 4a and an ASIC chip 5a received in the receiving space 2a, a waterproof part 7a bonded to the MEMS chip 4a, a first gold thread 8a and a second gold thread 9a.

The protective structure 1a includes a housing 11a and a PCB substrate 13a covering the housing 11a to form the receiving space 2a, and the PCB substrate 13a is provided with a sound hole 15a.

The MEMS chip 4a and the ASIC chip 5a are fixed on the PCB substrate 13a, wherein the MEMS chip 4a is electrically connected with the ASIC chip 5a via the first gold thread 8a, and the ASIC chip 5a is electrically connected with the PCB substrate 13a via the second gold thread 9a.

The MEMS chip 4a includes a first surface 401a away from the PCB substrate 13a and a second surface 402a opposite to the first surface 401a. The MEMS chip 4a includes a base 43a with a back cavity 41a and a capacitor structure 45a disposed on the base 43a. The back cavity 41a is communicated with the sound hole 15a. The base 43a includes a base bottom surface 431a located at the opening of the back cavity 41a and disposed close to the PCB substrate 13a. The capacitor structure 45a includes a backplate 451a and a diaphragm 453a opposite to the backplate 451a, and the position and quantity of the backplate 451a and the diaphragm 453a are not limited.

The waterproof part 7a is disposed between the MEMS chip 4a and the PCB substrate 13a and bonded to the second surface 402a of the MEMS chip 4a. Specifically, the waterproof part 7a is disposed between the base bottom surface 431a of the MEMS chip 4a and the PCB substrate 13a and covers the sound hole 15a.

The structure of the waterproof part 7a is same as that of the waterproof part 7 of embodiment 1, and is thus not redundantly described herein.

Embodiment 3

Figure 5:
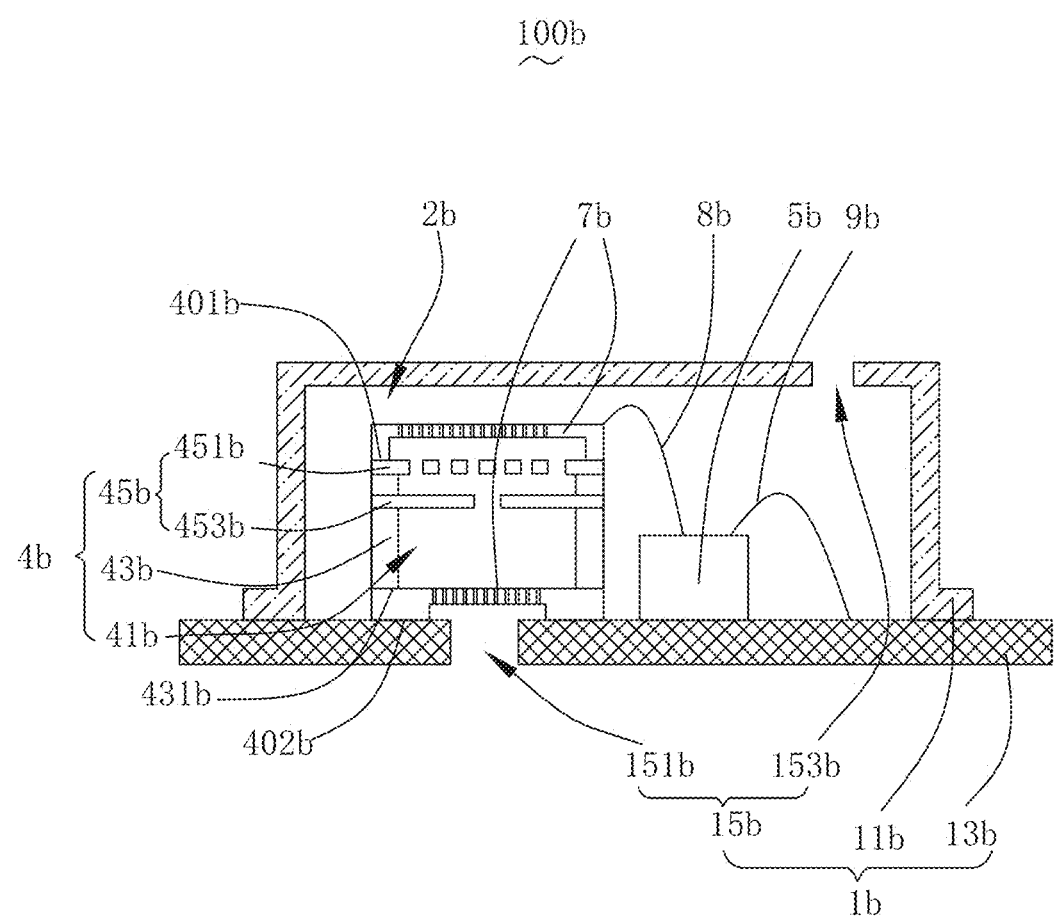
FIG. 5 is a structural schematic diagram of embodiment 3 of an MEMS microphone of the present disclosure.

Referring to FIG. 5, an MEMS microphone 100b includes a protective structure 1b with a receiving space, an MEMS chip 4b and an ASIC chip 5b received in the receiving space 2b, waterproof parts 7b bonded to the MEMS chip 4b, a first gold thread 8b and a second gold thread 9b.

The protective structure 1b includes a housing 11b, a PCB substrate 13b covering the housing 11b to form the receiving space 2b, and a sound hole 15b formed in the protective structure 1b.

The MEMS chip 4b and the ASIC chip 5b are fixed on the PCB substrate 13b, wherein the MEMS chip 4b is electrically connected with the ASIC chip 5b via the first gold thread 8b, and the ASIC chip 5b is electrically connected with the PCB substrate 13b via the second gold thread 9b.

The MEMS chip 4b includes a base 43b with a back cavity 41b and a capacitor structure 45b disposed on the base 43b. The base 43b includes a base bottom surface 431b located at the opening of the back cavity 41b and disposed close to the PCB substrate 13b. The capacitor structure 45b includes a backplate 451b and a diaphragm 453b opposite to the backplate 451b, and the position and quantity of the backplate 451b and the diaphragm 453b are not limited.

This embodiment differs from embodiment 1 and embodiment 2 in that: the sound hole 15b includes a first sound hole 151b formed in the housing 11b and a second sound hole 153b formed in the PCB substrate 13b, and the back cavity 41b is communicated with the second sound hole 153b; there are two waterproof parts 7b, which are respectively a first waterproof part and a second waterproof part, wherein the first waterproof part is bonded to the first surface 401b of the MEMS chip 4b, i.e., to the backplate 451b, and the second waterproof part is bonded to the second surface 402b of the MEMS chip 4b, i.e., to the base bottom surface 431b.

The structure of the waterproof parts 7b is same as that of embodiment 1 and embodiment 2, and is thus not redundantly described herein.

Compared with the prior art, the MEMS microphone provided by the present disclosure has the advantages that the waterproof part is directly bonded to the MEMS chip, so that the waterproof performance of the MEMS microphone is effectively improved, the bonding is simple and convenient, and the cost is effectively reduced; meanwhile, when the MEMS microphone is packaged, the assembly procedure is simpler; and the waterproof part is a silicon nitride waterproof part which can tolerate a temperature of over 350° C., so that the degree of temperature tolerance of the waterproof part is effectively improved and the service life of the MEMS microphone is thus prolonged.

It is to be understood, however, that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An MEMS microphone, comprising:
   a protective structure, comprising a housing and a PCB substrate covering the housing to form a receiving space, wherein the housing is provided with a sound hole;
   an MEMS chip with a back cavity, received in the receiving space and fixed on the PCB substrate, wherein the back cavity is communicated with the sound hole, and the MEMS chip comprises a first surface away from the PCB substrate and a second surface opposite to the first surface; and
   a waterproof part, bonded to the first surface of the MEMS chip, the waterproof part comprising a bottom plate and a plurality of through holes formed in the bottom plate, the waterproof part further comprising a vertical wall bent and extended from two sides of the bottom plate, and a depression formed between the bottom plate and the vertical wall.

2. The MEMS microphone as described in claim 1, wherein the aperture of the through holes is 0.6-1.4 μm.

3. The MEMS microphone as described in claim 1, further comprising an ASIC chip received in the receiving space and fixed on the PCB substrate.

4. An MEMS microphone, comprising:
   a protective structure, comprising a housing and a PCB substrate covering the housing to form a receiving space, wherein the PCB substrate is provided with a sound hole;
   an MEMS chip with a back cavity, received in the receiving space and fixed on the PCB substrate, wherein the back cavity is communicated with the sound hole, and the MEMS chip comprises a first surface away from the PCB substrate and a second surface opposite to the first surface; and
   a waterproof part, disposed between the MEMS chip and the PCB substrate and bonded to the second surface of the MEMS chip, the waterproof part comprising a bottom plate and a plurality of through holes formed in the bottom plate, the waterproof part further comprising a vertical wall bent and extended from two sides of the bottom plate, and a depression formed between the bottom plate and the vertical wall.

5. The MEMS microphone as described in claim 4, wherein the waterproof part is made of a silicon nitride material.

6. The MEMS microphone as described in claim 4, further comprising an ASIC chip received in the receiving space and fixed on the PCB substrate.

7. An MEMS microphone, comprising:
- a protective structure, comprising a housing and a PCB substrate covering the housing to form a receiving space, wherein the housing is provided with a first sound hole, and the PCB substrate is provided with a second sound hole;
- an MEMS chip with a back cavity, received in the receiving space and fixed on the PCB substrate, wherein the back cavity is communicated with the second sound hole, and the MEMS chip comprises a first surface away from the PCB substrate and a second surface opposite to the first surface;
- a first waterproof part, bonded to the first surface of the MEMS chip; and
- a second waterproof part, disposed between the MEMS chip and the PCB substrate and bonded to the second surface of the MEMS chip.

8. The MEMS microphone as described in claim 7, wherein the first waterproof part and the second waterproof part have the same structure, and respectively comprise a bottom plate and a plurality of through holes formed in the bottom plate.

9. The MEMS microphone as described in claim 8, wherein the aperture of the through holes is 0.6-1.4 µm.

10. The MEMS microphone as described in claim 9, further comprising an ASIC chip received in the receiving space and fixed on the PCB substrate.

\* \* \* \* \*